US012575003B2

(12) United States Patent
Tamura et al.

(10) Patent No.: US 12,575,003 B2
(45) Date of Patent: Mar. 10, 2026

(54) MODEL-BASED CONTROL METHOD, MODEL-BASED CONTROL SYSTEM, AND STORAGE MEDIUM

(71) Applicant: Tokyo Electron Limited, Tokyo (JP)

(72) Inventors: Jun Tamura, Miyagi (JP); Tomohisa Kitayama, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 646 days.

(21) Appl. No.: 18/098,712

(22) Filed: Jan. 19, 2023

(65) Prior Publication Data

US 2023/0239966 A1 Jul. 27, 2023

(30) Foreign Application Priority Data

Jan. 24, 2022 (JP) ................................. 2022-008643

(51) Int. Cl.
| | |
|---|---|
| *H05B 1/02* | (2006.01) |
| *G05B 13/04* | (2006.01) |
| *H01J 37/32* | (2006.01) |

(52) U.S. Cl.
CPC ......... *H05B 1/0233* (2013.01); *G05B 13/042* (2013.01); *H01J 37/32642* (2013.01); *H01J 37/32724* (2013.01); *H05B 1/0202* (2013.01); *H01J 2237/24564* (2013.01); *H01J 2237/24585* (2013.01)

(58) Field of Classification Search
CPC .... H05B 1/0202; H05B 1/0233; H05B 3/283; G05B 13/04; G05B 13/042; H01J 37/304;
H01J 37/3023; H01J 37/32642; H01J 37/32724; H01J 2237/24564; H01J 2237/24585; H01L 21/67103; H01L 21/67109; H01L 21/67248; H01L 21/68714
See application file for complete search history.

(56) References Cited

FOREIGN PATENT DOCUMENTS

| | | | | |
|---|---|---|---|---|
| JP | 2008269853 A | * 11/2008 | .......... | F27B 17/0025 |
| JP | 2019145730 A | * 8/2019 | ....... | H01L 21/67109 |
| JP | 2021-009769 A | 1/2021 | | |

* cited by examiner

*Primary Examiner* — Hung D Nguyen
(74) *Attorney, Agent, or Firm* — XSENSUS LLP

(57) ABSTRACT

A model-based control method includes: (a) acquiring temperature control data including temperature data of each of a plurality of zones of a temperature control member provided in a processing apparatus, temperature of each of the plurality of zones being individually controllable; (b) for each zone, specifying a temperature of another zone that is weight-averaged by a weighting coefficient determined according to a magnitude of heat transfer with the another zone; (c) for each zone, specifying a parameter of a state-space model of multi-input/single-output using the specified temperature of the another zone and the temperature control data; (d) creating a state-space model of multi-input/multi-output by assigning the specified parameter of the state-space model of multi-input/single-output to each element of the state-space model of multi-input/multi-output; and (e) controlling the temperature of each of the plurality of zones of the temperature control member using the state-space model of multi-input/multi-output.

13 Claims, 13 Drawing Sheets

| INITIAL TEMPERATURE OF EACH ZONE | | | | SET TEMPERATURE OF EACH ZONE | | | | POWER SUPPLY VOLTAGE | CHILLER TEMPERATURE |
|---|---|---|---|---|---|---|---|---|---|
| $x_1(1)$ | $x_2(1)$ | $\cdots$ | $x_n(1)$ | $SP_1(1)$ | $SP_2(1)$ | $\cdots$ | $SP_n(1)$ | $v(1)$ | $z(1)$ |
| $\vdots$ | $\vdots$ | $\ddots$ | $\vdots$ | $\vdots$ | $\vdots$ | $\ddots$ | $\vdots$ | $\vdots$ | $\vdots$ |
| $x_1(m)$ | $x_2(m)$ | $\cdots$ | $x_n(m)$ | $SP_1(m)$ | $SP_2(m)$ | $\cdots$ | $SP_n(m)$ | $v(m)$ | $z(m)$ |

FIG. 6B

| INITIAL TEMPERATURE OF EACH ZONE | | | | SET TEMPERATURE OF EACH ZONE | | | | POWER SUPPLY VOLTAGE | CHILLER TEMPERATURE |
|---|---|---|---|---|---|---|---|---|---|
| $x_1(1)$ | $x_2(1)$ | $\cdots$ | $x_n(1)$ | $u_1(1)$ | $u_2(1)$ | $\cdots$ | $u_n(1)$ | $v(1)$ | $z(1)$ |
| $\vdots$ | $\vdots$ | $\ddots$ | $\vdots$ | $\vdots$ | $\vdots$ | $\ddots$ | $\vdots$ | $\vdots$ | $\vdots$ |
| $x_1(m)$ | $x_2(m)$ | $\cdots$ | $x_n(m)$ | $u_1(m)$ | $u_2(m)$ | $\cdots$ | $u_n(m)$ | $v(m)$ | $z(m)$ |

*FIG. 17*

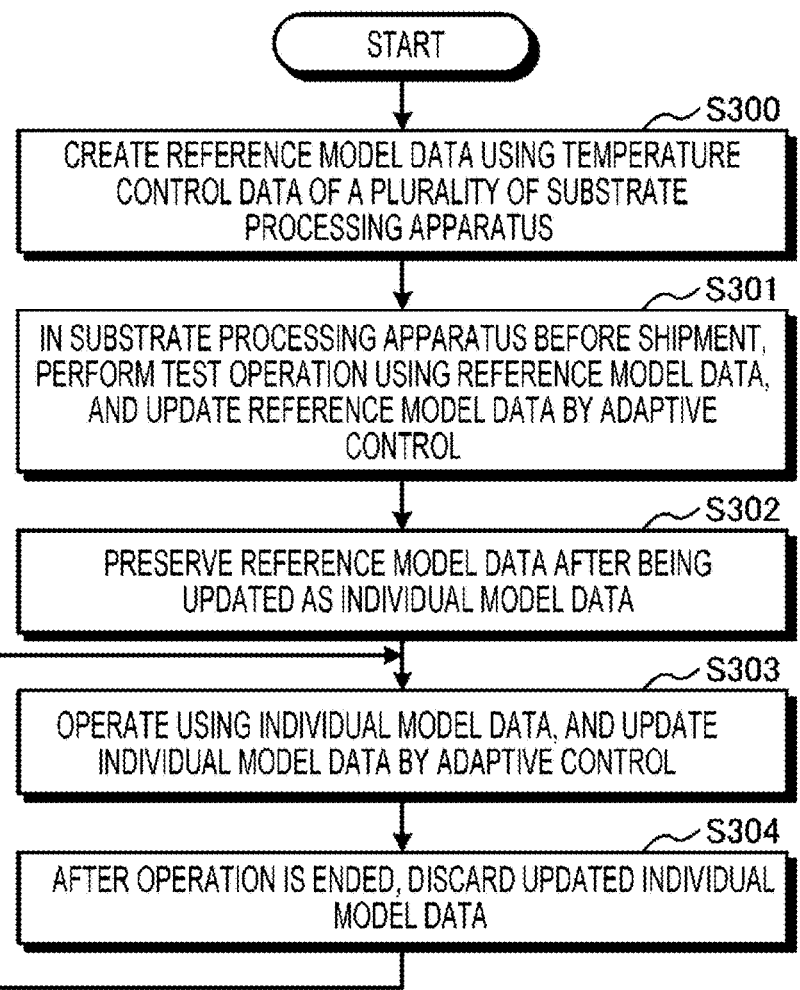

START

~S300

CREATE REFERENCE MODEL DATA USING TEMPERATURE CONTROL DATA OF A PLURALITY OF SUBSTRATE PROCESSING APPARATUS

~S301

IN SUBSTRATE PROCESSING APPARATUS BEFORE SHIPMENT, PERFORM TEST OPERATION USING REFERENCE MODEL DATA, AND UPDATE REFERENCE MODEL DATA BY ADAPTIVE CONTROL

~S302

PRESERVE REFERENCE MODEL DATA AFTER BEING UPDATED AS INDIVIDUAL MODEL DATA

~S303

OPERATE USING INDIVIDUAL MODEL DATA, AND UPDATE INDIVIDUAL MODEL DATA BY ADAPTIVE CONTROL

~S304

AFTER OPERATION IS ENDED, DISCARD UPDATED INDIVIDUAL MODEL DATA

*FIG. 18*

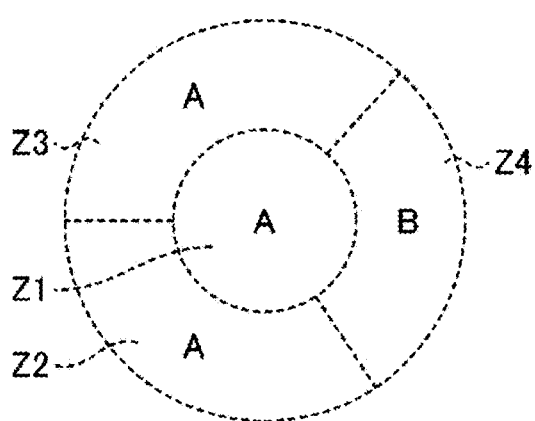

MODEL-BASED CONTROL METHOD, MODEL-BASED CONTROL SYSTEM, AND STORAGE MEDIUM

CROSS-REFERENCE TO RELATED APPLICATIONS

This application is based on and claims priority from Japanese Patent Application No. 2022-008643 filed on Jan. 24, 2022 with the Japanese Patent Office, the disclosure of which is incorporated herein in its entirety by reference.

TECHNICAL FIELD

The present disclosure relates to a model-based control method, a model-based control system, and a storage medium.

BACKGROUND

In a recent semiconductor manufacturing process, even a higher precision is required in control as the miniaturization is in progress. Among the process, it is important to control the temperature distribution of a substrate, which is a processing target, with a higher precision in the manufacturing process. In order to control the temperature distribution of the substrate with a higher precision, it is conceivable to divide a stage on which the substrate is placed into a plurality of areas and independently control the temperature of each area. However, when the number of areas in the stage in which the temperature may be independently controlled increases, the size of each area is reduced, and thus, it is difficult to provide both a heater and a temperature sensor in all areas.

In order to avoid the above problem, there is known a technique that estimates the temperature of each area from the relationship between the resistance value of the heater provided in each area of the stage where temperature is controllable independently and the temperature (see, e.g., Japanese Patent Laid-Open Publication No. 2021-009769). The resistance value of the heater is calculated from the measured values of the voltage and the current supplied to the heater. Therefore, it is not necessary to provide the temperature sensor separately from the heater in each area of the stage, and thus, more areas where temperature is controllable independently may be provided in the stage.

SUMMARY

A model-based control method according to an aspect of the present disclosure includes a process (a), a process (b), a process (c), a process (d), and a process (e). In the process (a), temperature control data including temperature data of each of a plurality of zones of a temperature control member provided in a processing apparatus, a temperature of each of the plurality of zones being individually controllable, is acquired. In the process (b), for each of the plurality of zones, a temperature of another zone that is weight-averaged is specified by a weighting coefficient determined according to a magnitude of heat transfer with the another zone. In the process (c), for each of the plurality of zones, a parameter of a state-space model of multi-input/single-output is specified by using the temperature of the another zone specified in (b) and the temperature control data acquired in (a). In the process (d), a state-space model of multi-input/multi-output is created by assigning the parameter of the state-space model of multi-input/single-output specified in (c) to each element of the state-space model of multi-input/multi-output. In the process (e), the temperature of each of the plurality of zones of the temperature control member is controlled by using the state-space model of multi-input/multi-output.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 6B is a view illustrating an example of temperature control data.

FIG. 17 is a flowchart illustrating an example of a procedure of an operation of model data using adaptive control.

FIG. 18 is a view illustrating an example of a method for determining a weighting coefficient when a zone made of a different material is provided.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, embodiments of a model-based control method, a model-based control system, and a program disclosed in the present disclosure will be described in detail with reference to the drawings. The model-based control method, the model-based control system, and the program disclosed are not limited to the embodiments.

When controlling the temperature distribution of a stage including a plurality of areas where temperature is controllable independently, the power supplied to the heater provided in each area is controlled such that the temperature of each area reaches the target temperature. The power supplied to the heater provided in each area is often controlled by so-called proportional-integral-differential (PID) in which the control amount is determined based on the deviation between the control result and the target value.

In PID control, since the deviation between the control result and the target value is decreased as the control result becomes close to the target value, the control amount is decreased. As a result, it takes a long time until the control result is stabilized near the target value. Further, when controlling the temperature distribution of the stage, since the temperature of each area of the stage is affected by the temperature of other zones, it is difficult to stabilize the temperature of each zone by controlling the power supplied to the heater based on the temperature of the area in which the heater is provided. As a result, it takes a long time to bring the temperature of each area to be close to the target value.

Therefore, the present disclosure is to provide a technique capable of more quickly bringing the temperature distribution of the temperature control member such as a heater to be close to the target temperature distribution.

First Embodiment

[Configuration of Substrate Processing System 1]

Figure 1:
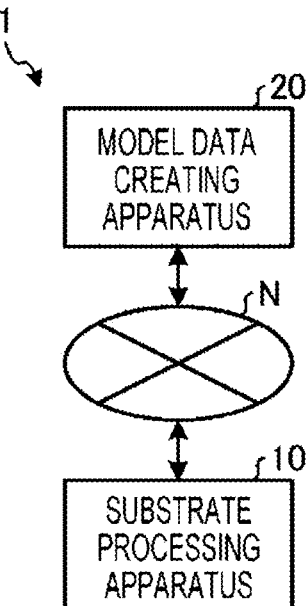
FIG. 1 is a view illustrating an example of a configuration of a substrate processing system.

FIG. 1 is a system configuration view illustrating an example of a configuration of a substrate processing system 1. The substrate processing system 1 includes a substrate processing apparatus 10 and a model data creating apparatus 20. The substrate processing apparatus 10 and the model data creating apparatus 20 are connected to each other via a communication network N such as a local area network (LAN). The substrate processing system 1 is an example of a model-based control system.

The substrate processing apparatus 10 includes a stage on which a substrate is placed. The stage includes a plurality of zones. The temperature of each zone may be individually controlled. The substrate processing apparatus 10 measures temperature data in each zone of the stage on which the substrate is placed under various processing conditions. Then, the measured temperature data of each zone is sent to the model data creating apparatus 20 as temperature control data via the communication network N.

Then, the substrate processing apparatus 10 receives model data (to be described later) from the model data creating apparatus 20 via the communication network N. Then, the substrate processing apparatus 10 controls the temperature of each zone of the stage using the model data received from the model data creating apparatus 20. Then, the substrate processing apparatus 10 performs a processing such as an etching on the substrate placed on the stage.

The model data creating apparatus 20 receives the temperature control data from the substrate processing apparatus 10 via the communication network N, and creates model data using the received temperature control data. The procedure of creating the model data will be described later.

Then, the model data creating apparatus 20 sends the created model data to the substrate processing apparatus 10 via the communication network N.

[Configuration of Substrate Processing Apparatus 10]

Figure 2:
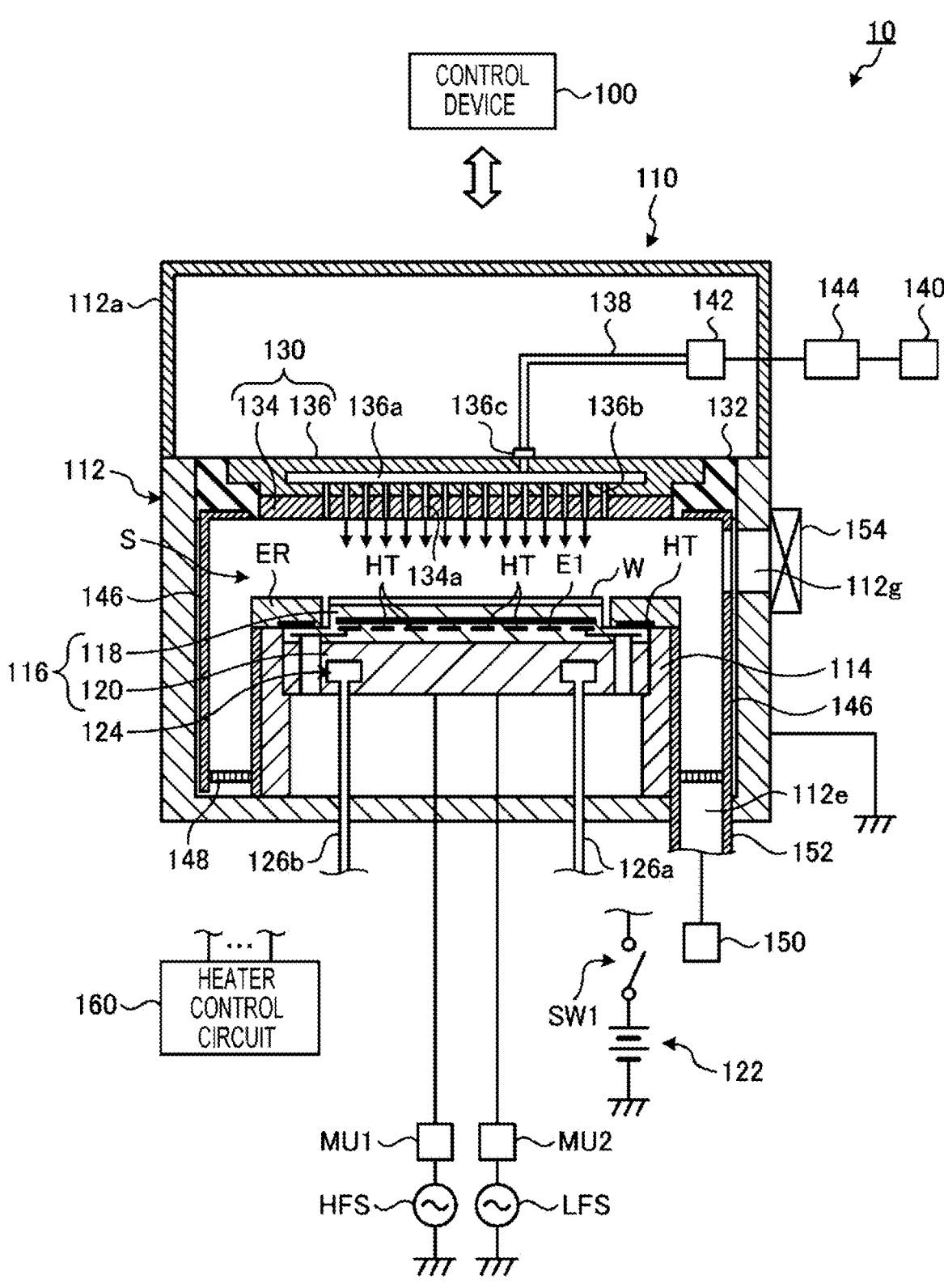
FIG. 2 is a schematic cross-sectional view illustrating an example of a substrate processing apparatus.

FIG. 2 is a schematic cross-sectional view illustrating an example of the substrate processing apparatus 10. In FIG. 2, a capacitively coupled parallel plate plasma etching apparatus is illustrated as an example of the substrate processing apparatus 10. The substrate processing apparatus 10 includes a control device 100 and an apparatus body 110.

For example, the apparatus body 110 includes a processing container 112 made of aluminum and formed in a substantially cylindrical shape. The surface of the processing container 112 is subjected to anodic oxidation treatment. The processing container 112 is grounded.

A stage 116 is provided in the processing container 112. The stage 116 adsorbs a substrate W on the upper surface thereof and controls the temperature of the substrate W. In the embodiment, the substrate W is a substantially disc-shaped substrate for manufacturing a semiconductor device, but the disclosed technique is not limited thereto. As another embodiment, the substrate W may have a shape other than a substantially disc shape such as a rectangular plate shape. Further, as another embodiment, the substrate W may be a substrate for manufacturing a device other than a semiconductor device such as a flat panel display (FPD).

The stage 116 includes an electrostatic chuck 118 and a base 120. The substrate W serving as a processing target is placed on the upper surface of the electrostatic chuck 118. The base 120 is formed in a substantially disc shape made of, for example, a conductive material such as aluminum. The base 120 also functions as a lower electrode. The base 120 is supported by a support portion 114. The support portion 114 is a substantially cylindrical member extending upward from the bottom portion of the processing container 112.

The base 120 is electrically connected with a radio-frequency (RF) power supply HFS via a matcher MIA. The RF power supply HFS generates an RF power for plasma generation and supplies the generated RF power to the base 120. The frequency of the RF power for plasma generation is a frequency within a range of 27 MHz to 100 MHz, and is a frequency of 40 MHz in the example. The matcher MU1 includes a circuit to match the output impedance of the RF power supply HFS and the input impedance of the load side (e.g., the base 120 side).

Further, the base 120 is electrically connected with a RF power supply LFS via a matcher MU2. The RF power supply LFS generates an RF power (RF bias power) for drawing ions to the substrate W, and supplies the generated RF bias power to the base 120. The frequency of the RF bias power is a frequency within a range of 400 kHz to 13.56 MHz, and is a frequency of 3 MHz in the example. The matcher MU2 includes a circuit to match the output impedance of the RF power supply LFS and the input impedance of the load side (e.g., the base 120 side).

The electrostatic chuck 118 is disposed on the base 120. The electrostatic chuck 118 adsorbs the substrate W by an electrostatic force and holds the substrate W on the upper surface of the electrostatic chuck 118. For example, the electrostatic chuck 118 includes an electrode E1 in the body made of ceramic. The electrode E1 is electrically connected with a DC power supply 122 via a switch SW1. The electrode E1 generates an electrostatic force on the surface of the electrostatic chuck 118 by a DC voltage supplied from the DC power supply 122, An annular edge ring ER is disposed above the upper surface of the base 120 and around the electrostatic chuck 118 to surround the substrate W. The edge ring ER improves uniformity of a plasma processing on the substrate W. The edge ring ER is made of a material appropriately selected depending on the plasma processing to be performed, such as silicon or quartz. The edge ring ER may be called a focus ring.

Figure 3:
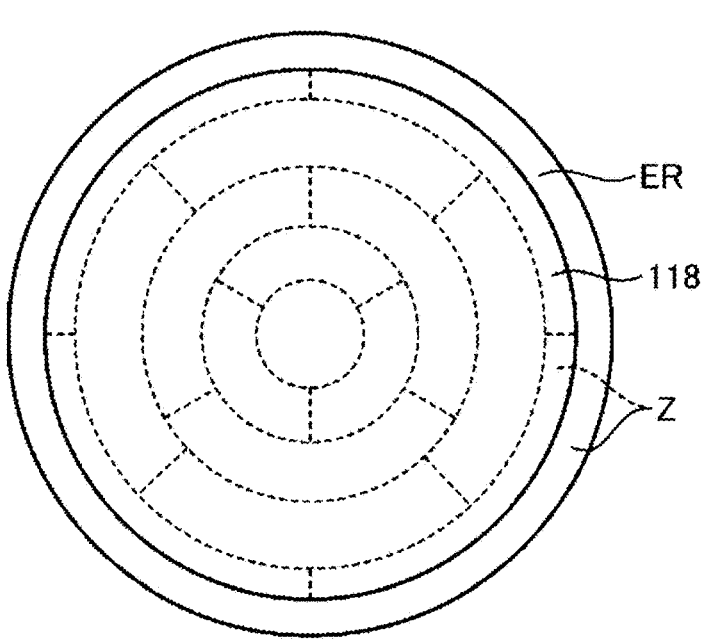
FIG. 3 is a top view illustrating an example of an electrostatic chuck and an edge ring.

Further, a plurality of heaters HT is provided in the electrostatic chuck 118. In the embodiment, the upper surface of the electrostatic chuck 118 is divided into a plurality of zones Z, for example, as illustrated in FIG. 3. In the example in FIG. 3, the upper surface of the electrostatic chuck 118 is divided into 15 zones Z. The number of zones is not limited to 15, and may be more than 15 or less than 15. Further, the method for dividing the zone Z is not limited to the example in FIG. 3, and the zones Z may be divided in a grid form, a concentric form, a radial form, or a combination thereof.

In the embodiment, one heater HT is provided for each zone Z. As another embodiment, two or more heaters HT may be provided for each zone Z, and the number of heaters HT may be different for the zones Z. In the embodiment, the heater HT is also provided on the lower surface of the edge ring ER. That is, in the embodiment, a total of 16 heaters are provided in the electrostatic chuck 118 and the edge ring ER. In the embodiment, the edge ring ER is also considered as one zone Z. As a result, in the embodiment, a total of 16 zones Z are provided in the electrostatic chuck 118 and the edge ring ER. The electrostatic chuck 118 and the edge ring ER are examples of the temperature control member. In the embodiment, the temperature control member is the electrostatic chuck 118 that includes a plurality of zones where temperature is controllable independently and controls the temperature distribution of the substrate W, but the disclosed technique is not limited thereto. The temperature control member may be a member other than the electrostatic chuck 118 as long as the member includes a plurality of zones where temperature is controllable independently.

Figure 4:
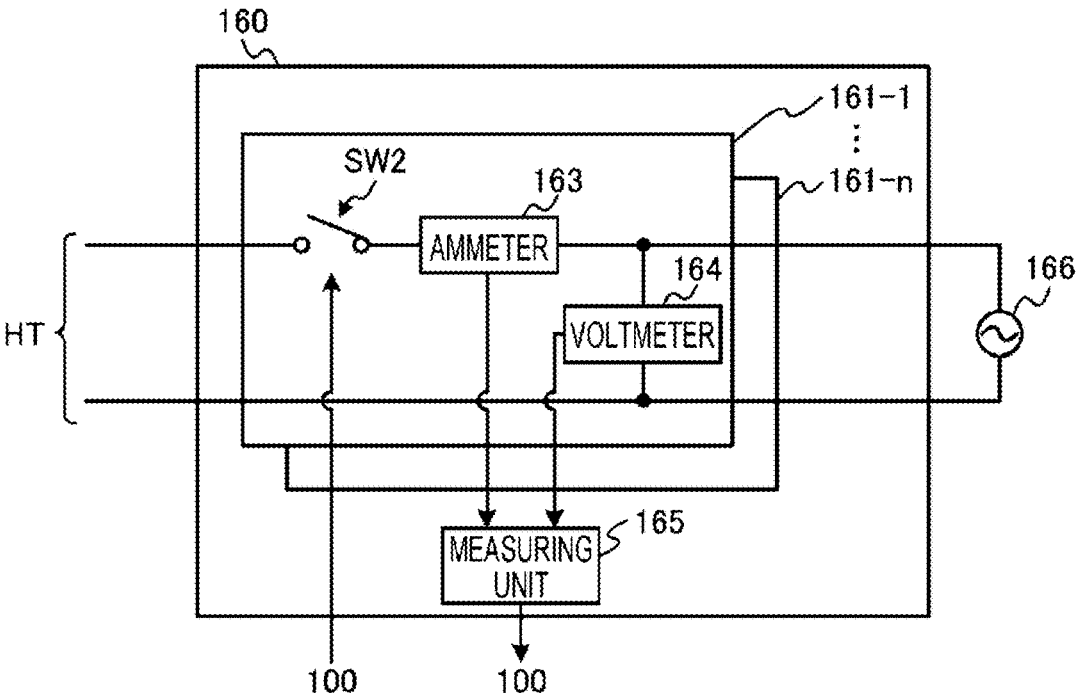
FIG. 4 is a view illustrating an example of a heater control circuit.

Each heater HT is connected to a heater control circuit 160. Each heater HT generates heat by the power individually supplied from the heater control circuit 160, and heats the corresponding zone Z. FIG. 4 is a view illustrating an example of the heater control circuit 160. The heater control circuit 160 includes a plurality of control blocks 161-1 to 161-n, and a measuring unit 165. Hereinafter, when the plurality of control blocks 161-1 to 161-n are collectively called without individually distinguishing, it is denoted as a control block 161.

One control block 161 is provided for one heater HT provided in each zone Z, and supplies power to the corresponding heater HT. The control block 161 includes an ammeter 163, a voltmeter 164, and a switch SW2.

The switch SW2 is turned on/off according to the control from the control device 100. Therefore, the power supplied from the power supply 166 to the corresponding heater HT is adjusted to the power according to ON/OFF duty ratio of the switch SW2. The ammeter 163 measures the current supplied from the power supply 166 to the corresponding heater HT, and outputs the measured value of the current to the measuring unit 165. The voltmeter 164 measures the voltage supplied from the power supply 166 to the corresponding heater HT, and outputs the measured value of the voltage to the measuring unit 165.

The measuring unit 165 measures the resistance value of each heater HT based on the measured values of the current and the voltage output from each control block 161. Then, the measuring unit 165 outputs measured resistance data for each heater HT to the control device 100.

The description will be continued by referring back to FIG. 2. A flow path 124 is formed inside the base 120. The flow path 124 is supplied with a coolant from a chiller unit (not illustrated) provided outside the processing container 112 through a pipe 126a. The coolant supplied to the flow path 124 returns to the chiller unit through a pipe 126b. The temperature of the coolant is controlled by the chiller unit.

An upper electrode 130 is provided in the processing container 112. The upper electrode 130 is disposed above the stage 116 to face the base 120. In the embodiment, the base 120 and the upper electrode 130 are disposed to be substantially parallel with each other.

The upper electrode 130 is supported by the upper portion of the processing container 112 via an insulating shielding member 132. The upper electrode 130 includes an electrode plate 134 and an electrode support 136. The electrode plate 134 faces a processing space S between the stage 116 and the upper electrode 130, and includes a plurality of ejection holes 134a. The electrode plate 134 may be made of a low resistance conductor or a semiconductor that generates low Joule heat.

The support 136 is made of, for example, a conductive material such as aluminum, and detachably supports the electrode plate 134 from above. The support 136 may have a water-cooled structure. A gas diffusion chamber 136a is provided inside the support 136. A plurality of gas flow holes 136b communicating with gas ejection holes 134a extends downward from the gas diffusion chamber 136a. Further, a gas introducing port 136c is formed in the support 136 to introduce a gas into the gas diffusion chamber 136a. A pipe 138 is connected to the gas introducing port 136c.

The pipe 138 is connected with a gas source group 140 via a valve group 142 and a flow rate controller group 144. The valve group 142 includes a plurality of opening/closing valves. The flow rate controller group 144 includes a plurality of flow rate controller such as a mass flow controller. The gas source group 140 includes a plurality of types of gas sources for gases required for the plasma processing. The plurality of gas sources provided in the gas source group 140 are connected to the pipe 138 via corresponding opening/closing valves and corresponding mass flow controllers.

In the substrate processing apparatus 10 illustrated in FIG. 2, one or more gases from one or more gas sources selected among the plurality of gas sources of the gas source group 140 are supplied to the pipe 138. The gas supplied to the pipe 138 is diffused inside the gas diffusion chamber 136a, and is ejected into the processing space S in a shower form through the gas flow holes 136b and the gas ejection holes 134a.

A ground conductor 112a is provided above the upper electrode 130 so as to cover the upper electrode 130. The ground conductor 112a is made of metal and is formed in a substantially cylindrical shape, and is grounded via the processing container 112.

In the processing apparatus 112, a deposit shield 146 is provided detachably along the inner wall of the processing container 112. The deposit shield 146 is also provided in the outer periphery of the support 114. The deposit shield 146 is formed by, for example, coating an aluminum material with ceramics such as $Y_2O_3$, and prevents etching by-products (so-called deposition) from adhering to the wall surface in the processing container 112.

On the bottom side of the processing container 112, an exhaust plate 148 formed by, for example, coating an aluminum material with ceramics such as $Y_2O_3$ is provided between the support 114 and the inner wall of the processing container 112. An exhaust port 112*e* is formed below the exhaust plate 148. An exhaust device 150 is connected to the exhaust port 112*e* via an exhaust pipe 152. The exhaust device 150 includes a vacuum pump such as a turbo molecular pump, and is capable of decompressing the inside of the processing container 112 to a desired degree of vacuum. Further, an opening 112*g* is formed in the side wall of the processing container 112 to carry in or carry out the substrate W. The opening 112*g* is opened/closed by a gate valve 154.

Figures 5, 6A:
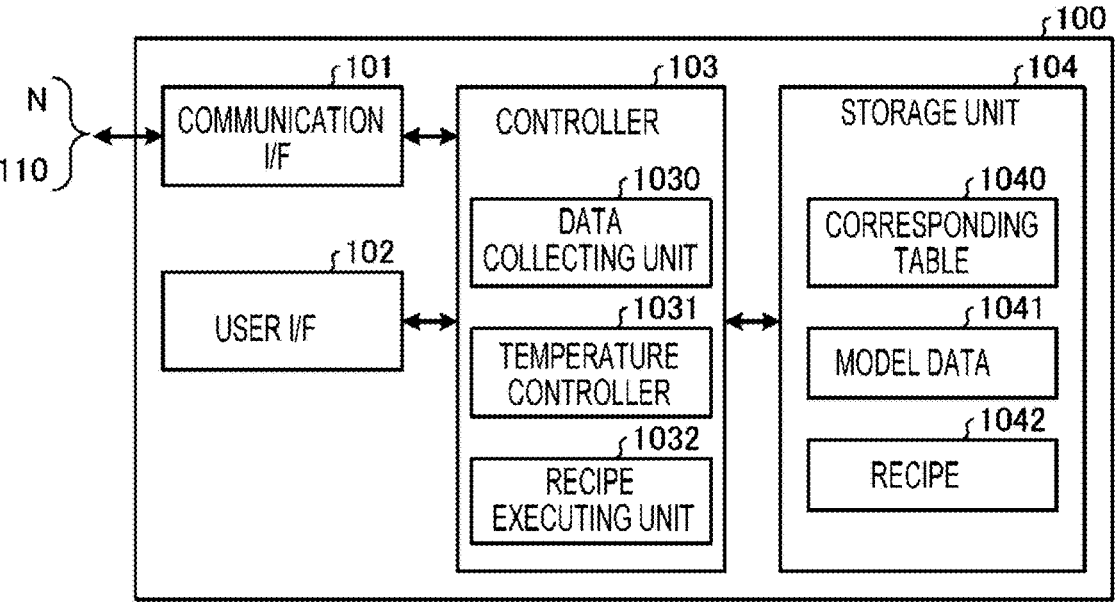
FIG. 5 is a view illustrating an example of a control device provided in a substrate processing apparatus of a first embodiment.
FIG. 6A is a view illustrating an example of temperature control condition data.

The operation of the apparatus body 110 configured as described above is collectively controlled by, for example, the control device 100 configured as illustrated in FIG. 5. For example, the control device 100 is realized by a computer. FIG. 5 is a view illustrating an example of the control device 100 provided in the substrate processing apparatus 10 of the first embodiment.

The control device 100 includes a communication I/F (interface) 101, a user I/F 102, a controller 103, and a storage unit 104. The controller 103 is an example of a second controller.

The communication I/F 101 communicates with the apparatus body 110. Further, the communication I/F 101 communicates with the model data creating apparatus 20 via the communication network N. The user I/F 102 provides an interface so that a user of the substrate processing apparatus 10 operates the substrate processing apparatus 10.

The storage unit 104 includes a random access memory (RAM), a read only memory (ROM), a hard disk drive (HDD), a solid state drive (SDD), or a combination thereof. The storage unit 104 stores a corresponding table 1040, model data 1041, and a recipe 1042. The corresponding table 1040 is data indicating a corresponding relationship between the resistance value of the heater HT and the temperature. The model data 1041 is model data indicating a change in the temperature of the heater HT in each zone Z created by the model data creating apparatus 20. The recipe 1042 is data including, for example, a processing condition of the substrate W. In addition to these, the storage unit 104 stores a program.

The controller 103 includes a processor such as a central processing unit (CPU) or a digital signal processor (DSP). The controller 103 executes the program stored in the storage unit 104 so as to realize each function of a data collecting unit 1030, a temperature controller 1031, and a recipe executing unit 1032.

The data collecting unit 1030 controls the apparatus body 110 according to an instruction from the model data creating apparatus 20 so as to collect resistance value data of the heater HT provided in each zone Z under a plurality of processing conditions. For example, the plurality of processing conditions are described in temperature control condition data illustrated in FIG. 6A. FIG. 6A is a view illustrating an example of the temperature control condition data. The temperature control condition data illustrated in FIG. 6A includes, for example, an initial temperature of each zone, a set temperature of each zone, a power supply voltage of the power supply 166 that supplies the power to the heater HT in the corresponding zone, and the temperature (chiller temperature) of the coolant controlled by the chiller unit. In the temperature control condition data illustrated in FIG. 6A, n refers to the number of zones, m refers the number of temperature control conditions, and SP (set point) refers to a set value or a target value.

Then, the data collecting unit 1030 specifies the temperature corresponding to the collected resistance value, with reference to the corresponding table 1040 in the storage unit 104. Then, the data collection unit 1030 creates the temperature control data including temperature data of each zone Z for each of the processing conditions. For example, when PID control is performed in order to acquire data for modeling, the control is performed while feeding back a resistance-converted temperature. Specifically, the resistance value is converted to a temperature, and the operation amount is determined based on the deviation between the temperature and the reference value. When data is acquired by inputting a predetermined operation amount such as an impulse response or a step response, it is also possible to collect only the resistance value, and then collectively convert to a temperature.

The temperature of each zone Z may be acquired through the substrate W placed on the electrostatic chuck 118. The temperature distribution of the substrate W placed on the electrostatic chuck 118 may be measured by, for example, a temperature sensor using an infrared ray or an optical fiber. By measuring the temperature distribution of the substrate W, it is possible to estimate the temperature of zone Z corresponding to the area of the substrate W.

FIG. 6B is a view illustrating an example of the temperature control data. In the temperature control data illustrated in FIG. 6B, the temperature of each zone Z, the operation amount of each zone, the power supply voltage, and the chiller temperature are corresponded. Then, the data collecting unit 1030 sends the created temperature control data to the model data creating apparatus 20 via the communication I/F 101.

When receiving the model data from the model data creating apparatus 20, the temperature controller 1031 stores the received model data in the storage unit 104. Further, when the recipe 1042 is executed by the recipe executing unit 1032, the temperature controller 1031 specifies the power supplied to the heater HT provided in each zone Z using the model data 1041. Then, for each heater HT, the temperature controller 1031 controls the switch SW2 of the corresponding heater control circuit 160 so as to supply the specified power.

The recipe executing unit 1032 executes the processing on the substrate W by controlling each part of the apparatus body 110 based on the recipe 1042.

[Configuration of Model Data Creating Apparatus 20]

Figure 7:
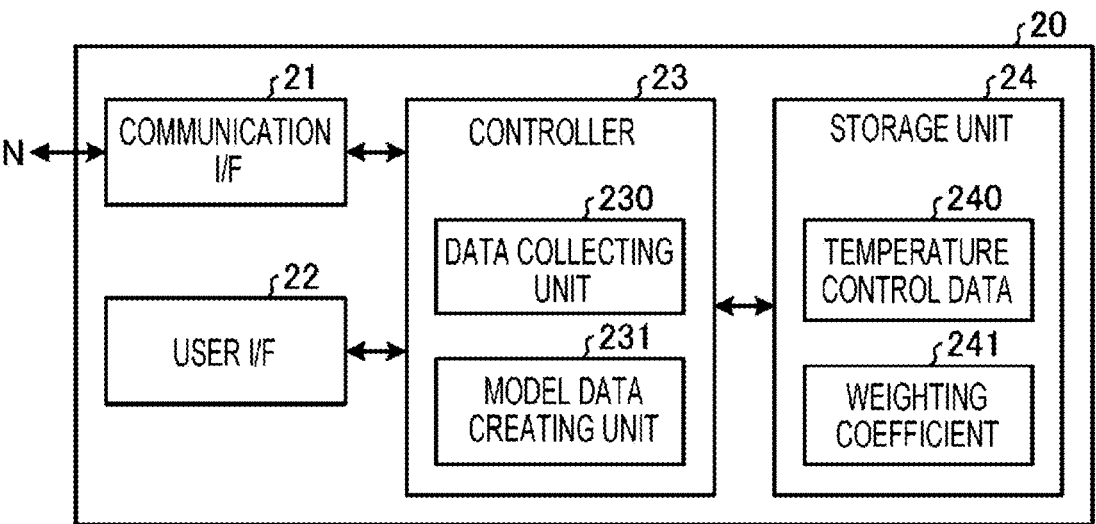
FIG. 7 is a view illustrating an example of a model data creating apparatus.

FIG. 7 is a view illustrating an example of the model data creating apparatus 20. For example, the model data creating apparatus 20 is realized by a computer. The model data creating apparatus 20 includes a communication I/F 21, a user I/F 22, a controller 23, and a storage unit 24. The controller 23 is an example of a first controller. The communication I/F 21 is an example of an output unit.

The communication I/F 21 communicates with the substrate processing apparatus 10 via the communication network N. The user I/F 22 provides an interface so that a user of the model data creating apparatus 20 operates the model data creating apparatus 20.

The storage unit 24 includes a RAM, a ROM, an SSD, or a combination thereof. The storage unit 24 stores temperature control data 240 and a weighting coefficient 241. The temperature control data 240 includes temperature data of each zone Z measured under various conditions in the substrate processing apparatus 10. The weighting coefficient 241 is data used for creating the model data. The details of the weighting coefficient 241 will be described later. In addition to these, the storage unit 24 stores a program.

The controller 23 includes a processer such as a CPU or a DSP. The controller 23 executes the program stored in the storage unit 24 so as to realize each function of a data collecting unit 230 and a model data creating unit 231.

The data collecting unit 230 instructs the substrate processing apparatus 10 to create the temperature control data via the communication I/F 21. Then, the temperature control data is received from the substrate processing apparatus 10 via the communication I/F 21, and the received temperature control data is stored in the storage unit 24.

The model data creating unit 231 creates model data obtained by modeling the change in the temperature of a plurality of heaters HT, with reference to the temperature control data 240 and the weighting coefficient 241. Then, the model data creating apparatus 231 sends the created model data to the substrate processing apparatus 10 via the communication I/F 21.

[Processing of Model Data Creating Apparatus 20]

Figure 8:
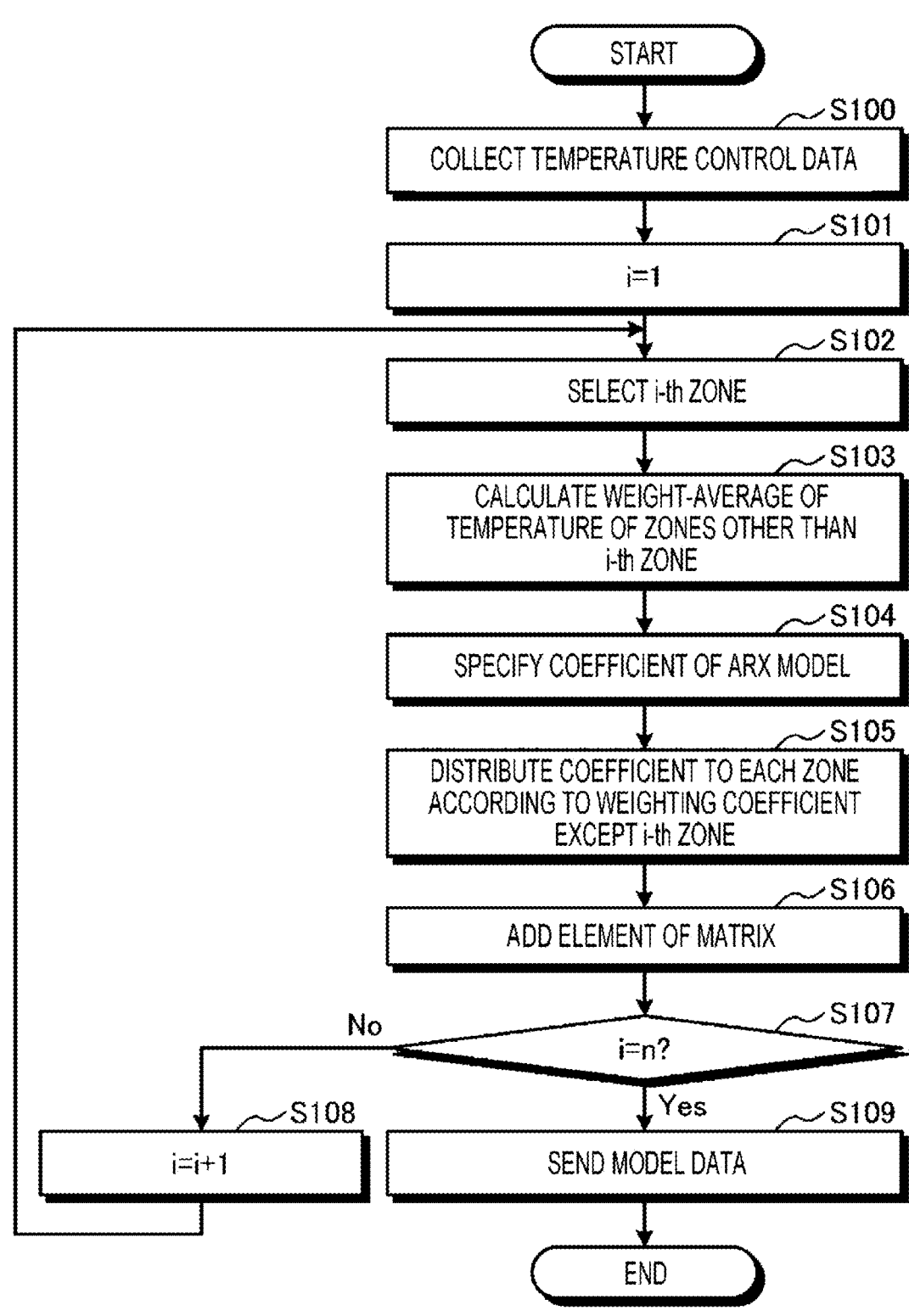
FIG. 8 is a view illustrating an example of a processing of the model data creating apparatus.

FIG. 8 is a flowchart illustrating an example of a processing of the model data creating apparatus 20. The processing illustrated in FIG. 8 is realized by reading the program from the storage unit 24 by the controller 23, and executing the read program. The processing illustrated in FIG. 8 and FIG. 10 (to be described later) is an example of a model-based control method.

First, the data collecting unit 230 instructs the substrate processing apparatus 10 to collect the temperature control data, and receives the temperature control data from the substrate processing apparatus 10 (S100). Then, the data collecting unit 230 stores the received temperature control data in the storage unit 24. Step S100 is an example of a process (a).

Subsequently, the model data creating unit 231 initializes the value of a variable i to 1 (S101). Then, an i-th zone Z is selected (S102). Then, the model data creating unit 231 calculates a weight-average of the temperature of the zones Z other than the i-th zone Z (S103). Step S103 is an example of a process (b).

Here, in the embodiment, the temperature of each zone Z is illustrated using a discretized state equation. Hereinafter, descriptions will be made on a case in which an auto-regressive exogenous (ARX) model is used as an example of the discretized state equation. Hereinafter, data of the ARX model may be referred to as model data. The ARX model is an example of a regression model. Further, the regression model is an example of a state-space model that outputs (specifies) a parameter of multi-input/single-output, and a coefficient of the regression model is an example of the parameter of the state-space model of multi-input/single-output. A temperature $x(t)$ of each zone Z is expressed, for example, by Equation (1) below, using the ARX model.

$$x_i(t+1) = a_i x_i(t) + b_i \sum_{j \neq i} w_{ij} x_j(t) + (c_i + d_i v(t)) u_i(t) + e_i z(t) + f_i \qquad (1)$$

In Equation 1 above, $x_i(t)$ refers to the temperature of the i-th zone Z. $u_i(t)$ refers to an operation amount of the power supplied to the heater HT in the i-th zone Z. $v(t)$ refers to a magnitude of the power supply voltage supplied to the heater HT in each zone Z. $z(t)$ refers to the temperature of the coolant supplied from the chiller unit (not illustrated) to the flow path 124 inside the base 120. $a_i$ refers to an autoregression coefficient of the i-th zone Z, and $b_i$ refers to the temperature coefficient of other zones Z other than the i-th zone Z. $c_i$ refers to an operation amount coefficient of the power supplied to the heater HT in the i-th zone Z, and $d_i$ refers to a cross term coefficient of the power supply voltage supplied to the heater HT in the i-th zone Z and the magnitude of the operation amount. $e_i$ refers to a temperature coefficient of the coolant that affects the i-th zone Z, and $f_i$ refers to a constant term for the i-th zone Z.

In step S103, in Equation (1), a term expressed by Equation (2) below is calculated as a weight-average of the temperature of the zones Z other than the i-th zone Z.

$$\sum_{j \neq i} w_{ij} x_j(t) \qquad (2)$$

Figure 9:
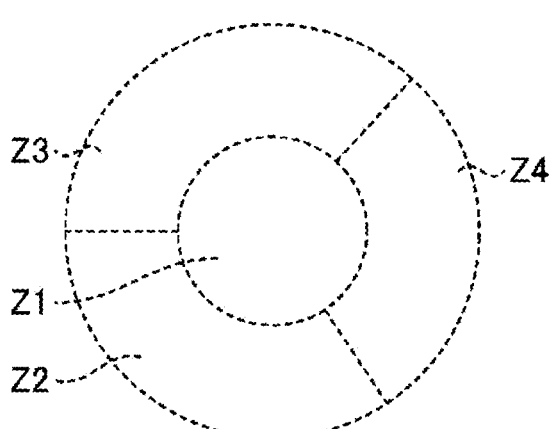
FIG. 9 is a view illustrating an example of a method for determining a weighting coefficient.

In Equation 2 above, with respect to the i-th zone Z, $w_{ij}$ refers to the magnitude of heat transfer with a j-th zone Z, which is different from the i-th zone Z, and is a positive weighting coefficient with a sum of 1. In the embodiment, the weighting coefficient w is determined based on the area of the boundary surface with adjacent zones Z. Specifically, for example, as illustrated in FIG. 9, a second zone to a fourth zone Z2 to Z4 are adjacent to the surrounding of a first zone Z1. When the areas of the boundary surface between the zone Z1 and each of the zones Z2 to Z4 are the same, the weighting coefficient $w_{ij}$ becomes $w_{12} = w_{13} = w_{14} = \frac{1}{3}$. In the example in FIG. 9, it is assumed that the zones Z1 to Z4 are made of the same material. Further, when the thicknesses of the boundary surface between the zone Z1 and each of the zones Z2 to Z4 are the same, the weighting coefficients $w_{12}$, $w_{13}$, and $w_{14}$ correspond to the boundary lengths of the electrostatic chuck 118 in a plane direction between the zone Z1 and each of the second to fourth zones Z.

In the embodiment, the weighting coefficient w with respect to the non-adjacent zones Z is assumed to be zero. Therefore, it is possible to reduce the calculation amount by the model data creating unit 231. Further, the weighting coefficient $w_{ij}$ is uniquely determined when the arrangement of each zone Z is determined. As a result, in the embodiment, the weighting coefficient $w_{ij}$ is calculated in advance before the processing illustrated in FIG. 8 is performed, and is stored in the storage unit 24.

Further, in the embodiment, the weighting coefficient w is a positive value with a sum of 1. Therefore, it is possible to suppress the influence of multicollinearity when specifying the coefficient of the regression model, and it is possible to precisely specify the coefficient of the regression model.

Subsequently, the model data creating unit 231 specifies coefficients $a_i$ to $f_i$ of the ARX model expressed by Equation (1) above (S104). Step S104 is an example of a process (c). In step S104, the ARX model is trained by a regression algorithm using the temperature control data, so that the coefficients $a_i$ to $f_i$ of the ARX model are specified. The coefficient of the regression model is specified by using, for example, the regression algorithm such as ordinary least squares regression (OLS), Lasso, Ridge, or Elastic Net.

Subsequently, the model data creating unit 231 distributes the coefficient $b_i$ to each zone Z other than the i-th zone according to the weighting coefficient $w_{ij}$ (S105). In step S105, the coefficient $b_i$ distributed to the j-th zone Z becomes $b_i w_{ij}$.

Subsequently, the model data creating unit 231 adds the coefficient $b_i$ distributed to each zone Z other than the i-th zone according to the weighting coefficient $w_{ij}$ to the elements of the matrix (S106). Steps S105 and S106 are examples of a process (d).

Then, the model data creating unit 231 determines whether the value of the variable i has reached the value of a constant n referring to the number of zones Z (S107). When the value of the variable i has not reached the value of the constant n (S107: No), the model data creating unit 231 increases the value of variable i by 1 (S108), and performs the processing described in step S102 again.

Meanwhile, when the value of the variable i has reached the value of the constant n (S107: Yes), the model data creating unit 231 sends the model data including the matrix to which the element is added in step S106 to the substrate processing apparatus 10 via the communication I/F 21 (S109). Then, the model data creating apparatus 20 ends the processing described in the flowchart.

The model data sent to the substrate processing apparatus 10 in step S109 is expressed, for example, by Equation (3) below. The model data in the embodiment is an example of a state-space model of multi-input/multi-output.

$$x(t+1)=Ax(t)Bx(t)+C \quad (3)$$

In Equation (3) above, the matrix x(t+1) is expressed, for example, by Equation (4) below.

$$x(t) = \begin{bmatrix} x_1(t) \\ \vdots \\ x_n(t) \end{bmatrix} \quad (4)$$

Further, in Equation (3) above, the matrix A is expressed, for example, by Equation (5) below.

$$A = \begin{bmatrix} a_1 & b_1w_{12} & \dots & b_1w_{1n} \\ b_2w_{21} & a_2 & \dots & b_2w_{2n} \\ \vdots & \vdots & \ddots & \vdots \\ b_nw_{n1} & b_nw_{n2} & \dots & a_n \end{bmatrix} \quad (5)$$

Further, in Equation (3) above, the matrix B is expressed, for example, by Equation (6) below.

$$B = \begin{bmatrix} c_1 + d_1v(t) & 0 & \dots & 0 \\ 0 & c_2 + d_2v(t) & \dots & 0 \\ \vdots & \vdots & \ddots & \vdots \\ 0 & 0 & \dots & c_n + d_nv(t) \end{bmatrix} \quad (6)$$

Further, in Equation (3) above, the matrix C is expressed, for example, by Equation (7) below.

$$C = \begin{bmatrix} e_1z(t) + f_1 \\ e_2z(t) + f_2 \\ \vdots \\ e_nz(t) + f_n \end{bmatrix} \quad (7)$$

[Processing of Substrate Processing Apparatus 10]

Figure 10:
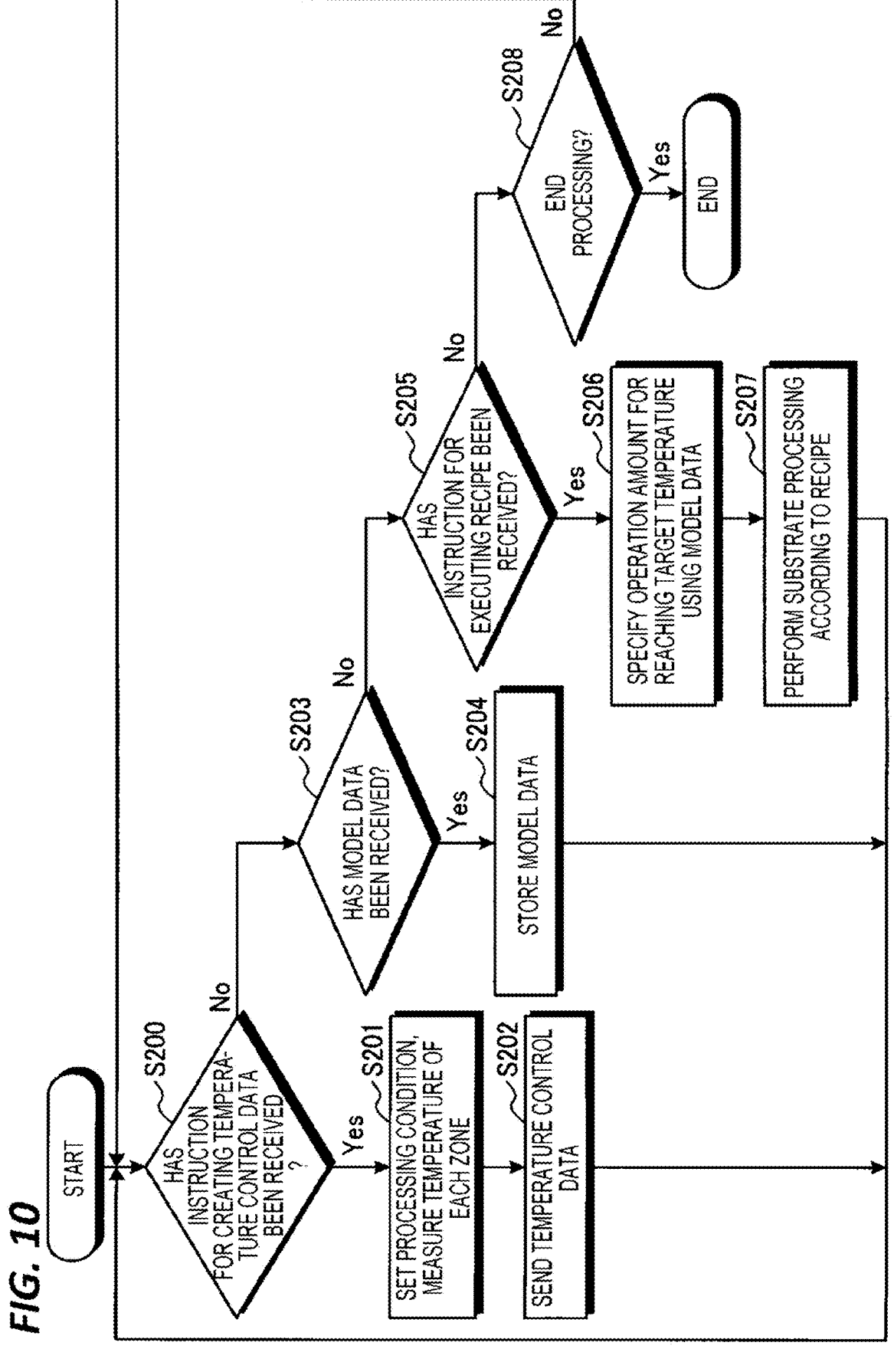
FIG. 10 is a flowchart illustrating an example of a processing of the substrate processing apparatus.

FIG. 10 is a flowchart illustrating an example of a processing of the substrate processing apparatus 10. The processing illustrated in FIG. 10 is realized by reading the program from the storage unit 104 by the controller 103 of the control device 100, and executing the read program. The processing illustrated in FIG. 10 is an example of a process (e).

First, the data collecting unit 1030 determines whether the instruction for creating the temperature control data has been received from the model data creating apparatus 20 via the communication I/F 101 (S200). When the instruction for creating the temperature control data has been received (S200: Yes), the data collecting unit 1030 sets the processing condition and measures the temperature of each zone Z (S201). In step S201, the data collecting unit 1030 controls the apparatus body 110 so as to collect the resistance value data of the heater HT provided in each zone Z under a plurality of processing conditions. Then, the data collecting unit 1030 specifies the temperature corresponding to the collected resistance value, with reference to the corresponding table 1040 in the storage unit 104. Then, the data collection unit 1030 creates the temperature control data including temperature data of each zone Z for each of the processing conditions.

Subsequently, the data collecting unit 1030 sends the temperature control data created in step S201 to the model data creating apparatus 20 via the communication I/F 101 (S202). Then, the processing described in step S200 is performed again.

Meanwhile, when the instruction for creating the temperature control data has not been received (S200: No), the temperature controller 1031 determines whether the model data has been received from the model data creating apparatus 20 via the communication I/F 101 (S204). When the model data has been received (S203: Yes), the temperature controller 1031 stores the received model data in the storage unit 104 (S204). Then, the processing described in step S200 is performed again.

Meanwhile, when the model data has not been received (S203: No), the temperature controller 1031 and the recipe executing unit 1032 determine whether the instruction for executing the recipe has been received from the user of the substrate processing apparatus 10 via the user I/F 102 (S205). When the instruction for executing the recipe has been received (S205: Yes), the temperature controller 1031 specifies the power supplied to the heater HT provided in each zone Z as the operation amount using the model data 1041 in the storage unit 104 (S206).

In step S206, the temperature controller 1031 specifies the temperature of each zone Z having the temperature distribution designated by the recipe 1042 in the storage unit 104. Then, with the specified temperature as a target value, the temperature controller 1031 specifies the power supplied to the heater HT in each zone Z as the operation amount using the model data 1041 in the storage unit 104. Further, the temperature controller 1031 specifies the power supplied to the heater HT in each zone Z using the model data 1041, for example, by a method such as an optimal regulator or model prediction control. Then, for each heater HT, the temperature controller 1031 controls the switch SW2 of the corresponding heater control circuit 160 so as to supply the specified power.

Subsequently, the recipe executing unit 1032 executes the processing of the substrate W by controlling each part of the apparatus body 110 according to the recipe 1042 (S207).

Meanwhile, when the instruction for executing the recipe has not been received (S205: No), the recipe executing unit 1032 determined whether to end the processing (S208). When the processing is not ended (S208: No), the processing described in step S200 is executed again. Meanwhile, when the processing is ended by an instruction from the user of the substrate processing apparatus 10 via the user I/F 102 (S208: Yes), the processing described in this flowchart is ended.

[Simulation Result]

Figure 11:
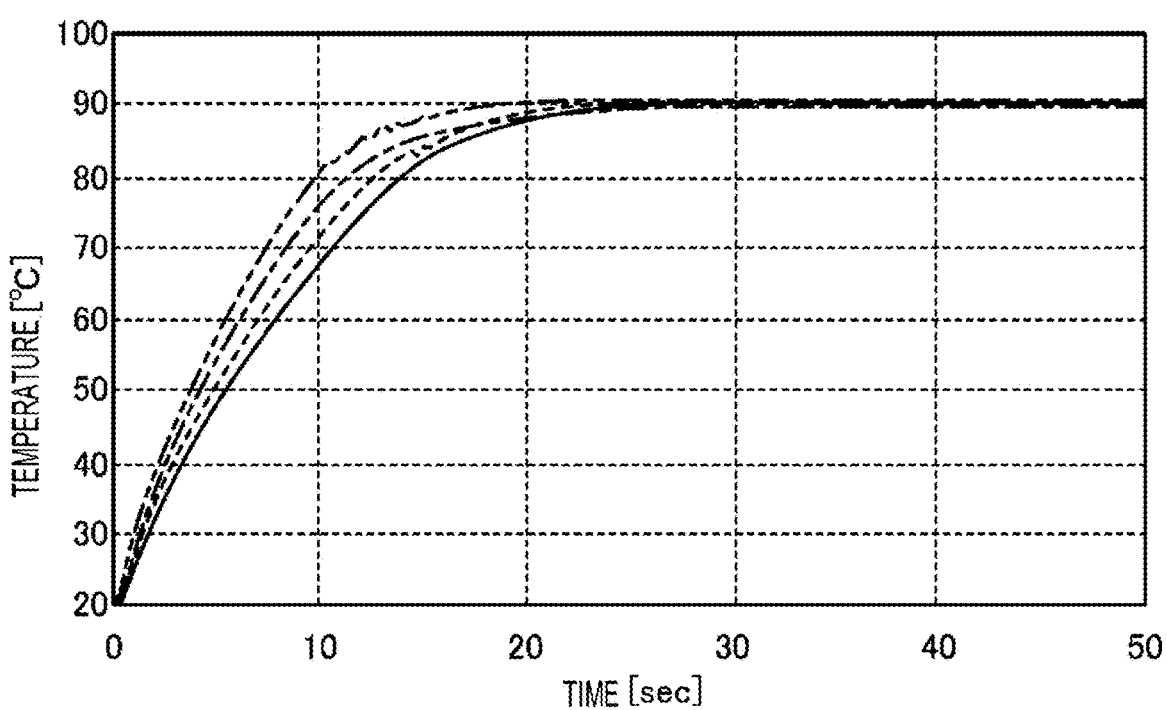
FIG. 11 is a view illustrating an example of a change in a temperature of each zone in temperature control of a comparative example.
Figure 12:
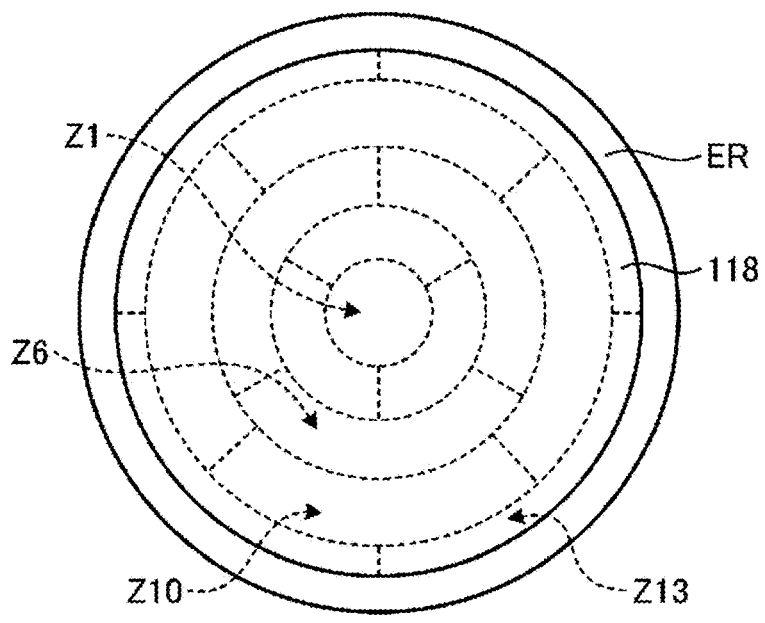
FIG. 12 is a view illustrating an evaluation target zone.

Here, the superiority of the temperature control method of the embodiment will be described. FIG. 11 is a view illustrating an example of a change in the temperature of each zone Z in temperature control of a comparative example. In the comparative example, the power supplied to the heater HT in each zone Z is controlled by PID. FIG. 11 illustrates the change in the temperature of four zones Z1, Z6, Z10, and Z13 with relatively large temperature differences among the plurality of zones Z as illustrated in FIG. 12. In the example in FIG. 11, the temperature of each zone Z is controlled to be 90° C.

As illustrated in FIG. 11, when the temperature of each zone Z is individually controlled by PID, the temperature of each zone Z is not sufficiently stable in 200 msec after the start of the control. Further, in the comparative example in FIG. 11, even in the process of changing the temperature of each zone Z, the difference in a temperature change rate of each zone Z is large, and the temperature difference in each zone Z becomes large. As a result, when the processing on the substrate W is started before the temperature of the substrate W is stabilized at the target temperature, the ununiformity of the temperature distribution of the temperature W is large, and thus, the uniformity of the processing on the substrate W may be deteriorated.

Figure 13:
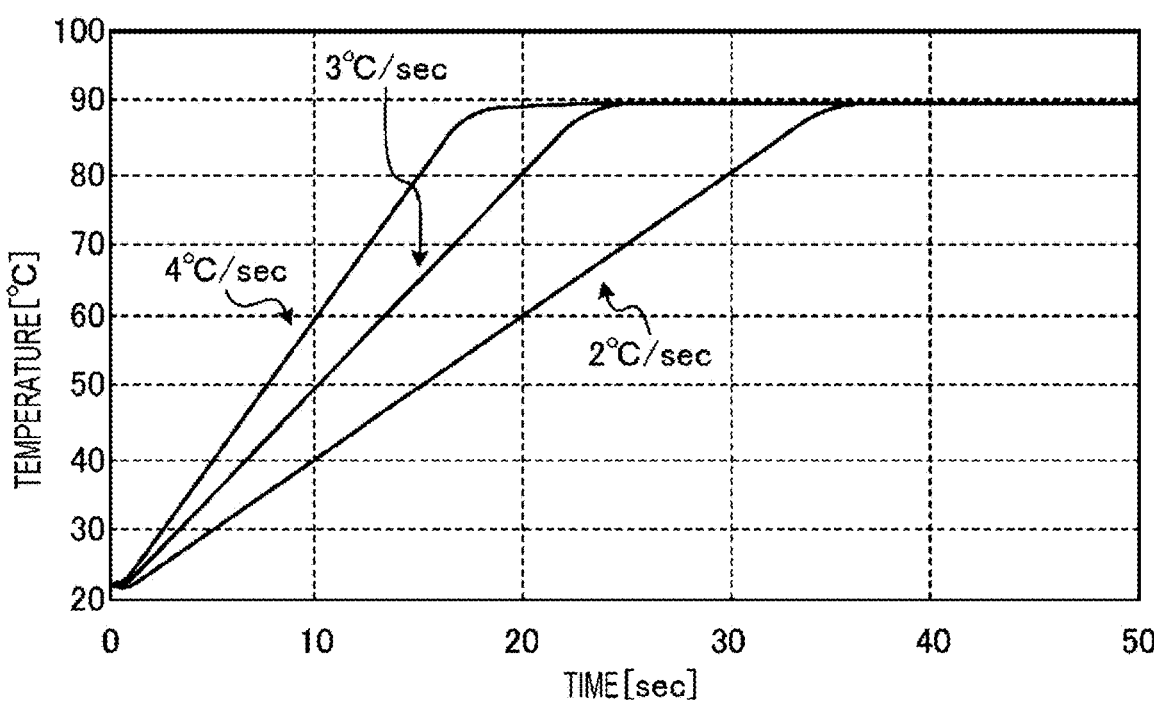
FIG. 13 is a view illustrating an example of a change in a temperature of each zone in temperature control of the embodiment.

With regard to this, when the model-based temperature control method according to the embodiment is used, the change in the temperature of each zone Z is changed as illustrated in FIG. 13. FIG. 13 is a view illustrating an example of a change in the temperature of each zone Z in temperature control of the embodiment. Although FIG. 13 illustrates the change in the temperature of the four zones Z1, Z6, Z10, and Z13 illustrated in FIG. 12, the change in the temperature of each zone Z is substantially the same, and thus, the trajectories of the change in the temperature are substantially overlapped.

As illustrated in FIG. 13, when the temperature of each zone Z is controlled at 4° C./sec by the model-based control of the embodiment, the temperature of each zone Z is sufficiently stabilized at the target temperature in 200 msec after the start of the control. Therefore, according to the temperature control method of the embodiment, it is possible to more quickly bring the temperature distribution of the electrostatic chuck 118 and the edge ring ER to be close to the target temperature distribution. Further, in the example in FIG. 13, even in the process of changing the temperature of each zone Z, the difference in a temperature change rate of each zone Z is small, and the temperature difference in each zone Z becomes small. As a result, when the processing on the substrate W is started before the temperature of the substrate W is stabilized at the target temperature, the ununiformity of the temperature distribution of the temperature W is small, and the uniformity of the processing on the substrate W may be improved. As illustrated in FIG. 13, by precisely designating the temperature on the way to the final target temperature as a target temperature as well, it is also possible to realize the change in the temperature with an arbitrary inclination such as 3° C./sec and 2° C./sec.

In the above, the first embodiment has been described. As described above, the model-based control method according to the embodiment includes the process (a), the process (b), the process (c), the process (d), and the process (e). In the process (a), the temperature control data including the temperature data of each zone Z of the temperature control member provided in the substrate processing apparatus 10 and including a plurality of zones Z where temperature is controllable independently is acquired. In the process (b), for each zone Z, the temperature of other zones Z that are weight-averaged is specified by the weighting coefficient w determined according to the magnitude of heat transfer with the other zones Z. In the process (c), for each zone Z, the parameter of the state-space model of multi-input/single-output is specified by using the specified temperature of the other zones and the temperature control data. In the process (d), the model data is created by assigning the specified parameter of the state-space model of multi-input/single-output to each element of the model data, which is an example of the state-space model of multi-input/multi-output. In the process (e), the temperature of each zone Z of the temperature control member is controlled by using the model data. Therefore, it is possible to more quickly bring the temperature distribution of the temperature control member to be close to the target temperature distribution.

Here, when the temperature distribution of the stage is controlled, the temperature of each zone of the stage is affected by the temperature of other zones. As a result, when the influence of thermal interference of the temperature of each zone on the temperature of adjacent zones is individually estimated, experimental data obtained by executing the temperature control with a huge number of combinations is required, which is impractical. With regard to this, in the model-based control method of the embodiment, the temperature of each zone is estimated using a regression model, and thus, it is possible to precisely control the temperature of each zone even with not much experimental data.

Further, in the embodiment described above, the weighting coefficient w of each zone Z is determined based on the area of the boundary surface or the length of the boundary with other adjacent zones Z, and the weighting coefficient w with respect to other non-adjacent zones Z is zero. Here, as the number of zones increases, the number of parameters that may be included in explanatory variables increases, but it is necessary to exclude parameters that are not related with each other. In the embodiment described above, the number of explanatory variables may be reduced by setting the weighting coefficient w for other non-adjacent zones Z to zero. Therefore, it is possible to reduce the calculation amount when creating the model data.

Further, in the embodiment described above, the temperature control member is the stage 116 on which the substrate W is placed and that controls the temperature of the substrate W. Therefore, it is possible to more quickly bring the temperature distribution of the substrate W at the time of processing the substrate W to be close to the target temperature distribution.

Further, in the embodiment described above, the state-space model of multi-input/multi-output includes the term indicating the temperature of the coolant controlled by the chiller unit that cools the plurality of zones Z, and the term indicating the magnitude of the power supply voltage supplied to the heater HT that heats the plurality of zones Z. Therefore, even when the temperature of the coolant and the power supply voltage are changed, reproducible control may be performed, and control may be performed with a designated trajectory of the change in temperature.

Further, in the embodiment described above, the state-space model of multi-input/single-output is the ARX model. Therefore, it is possible to precisely model the state of the temperature control member including a plurality of zones Z.

Further, in the embodiment described above, the parameter of the state-space model of multi-input/single-output is specified using OLS, Lasso, Ridge, or Elastic Net. Therefore, the coefficient of the regression model may be precisely specified. In particular, it is possible to suppress overtraining by using Lasso, Ridge, or Elastic Net.

Further, in the embodiment described above, at least one zone of the plurality of zones is different from other adjacent zones in at least one of the shape of the zone, the shape of the boundary, or the material. When the adjacent states with the adjacent zones are different, the weighting coefficient between the adjacent zones becomes different, and thus, it is more difficult to prepare experimental data. With regard to this, in the embodiment, by using the state-space model of multi-input/multi-output, even when the adjacent states with the adjacent zones are different, it is possible to precisely estimate the temperature of a plurality of zones with less experimental data.

Further, in the embodiment described above, the temperature control data including the temperature of each zone is acquired through the substrate placed on the temperature control member.

Further, in the embodiment described above, the weighting coefficient is a positive value with a sum of 1. Here, when a plurality of zones is modeled at the same time using data obtained by controlling the temperature, a high correlation occurs between the zones, and thus, the coefficient of the model cannot be determined correctly due to the influence of multicollinearity. With regard to this, in the model-based control method of the embodiment, the modeling is executed using positive weighting coefficient with a sum of 1. Therefore, it is possible to suppress the correlation between the zones Z with respect to the temperature from being too high, and to suppress the influence of multicollinearity.

Further, in the embodiment described above, the the substrate processing system 1 is a model-based control system, and includes the substrate processing apparatus 10 and the model data creating apparatus 20. The model data creating apparatus 20 includes the controller 23 configured to create the state-space model, and the communication I/F 21 configured to output the state-space model to the substrate processing apparatus 10. The substrate processing apparatus 10 includes the temperature control member configured to include a plurality of zones Z where temperature is controllable independently, the storage unit 104 configured to acquire and store the state-space model created by the model data creating apparatus 20, and the controller 103 configured to control the temperature of each zone Z of the temperature control member using the state-space model stored in the storage unit 104. The controller 23 of the model data creating apparatus 20 performs the process (a), the process (b), the process (c), and the process (d). In the process (a), the temperature control data including temperature data of each zone Z measured in the temperature control member is acquired. In the process (b), for each zone Z, the temperature of other zones Z that are weight-averaged is specified using the weighting coefficient w that is determined according to the magnitude of heat transfer with the other zones Z, and is a positive weighting coefficient w with a sum of 1. In the process (c), for each zone Z, the coefficient of the regression model is specified by training the regression model using the specified temperature of the other zones using the temperature control data. In the process (d), the model data is created by assigning the specified coefficient of the regression model to each element of the model data, which is an example of the state-space model of multi-input/multi-output. High control performance is realized by creating the model data and model-based controlling using the model data. Therefore, the substrate processing apparatus 10 can more quickly bring the temperature distribution of the temperature control member to be close to the target temperature distribution.

Further, the program of the embodiment described above is a program that causes a computer to execute the process (a), the process (b), the process (c), and the process (d). In the process (a), the temperature control data including the temperature data of each zone Z measured in the temperature control member provided in the substrate processing apparatus 10 and including a plurality of zones Z where temperature is controllable independently, is acquired. In the process (b), for each zone Z, the temperature of other zones Z that are weight-averaged is specified using the weighting coefficient w that is determined according to the magnitude of heat transfer with the other zones Z, and is a positive weighting coefficient w with a sum of 1. In the process (c), for each zone Z, the coefficient of the regression model is specified by training the regression model using the specified temperature of the other zones using the temperature control data. In the process (d), the model data is created by assigning the specified coefficient of the regression model to each element of the model data, which is an example of the state-space model of multi-input/multi-output. The substrate processing apparatus 10 may more quickly bring the temperature distribution of the temperature control member to be close to the target temperature distribution by controlling the temperature distribution of the temperature control member using the model data created by the computer.

Second Embodiment

In a second embodiment, during the operation of the substrate processing apparatus 10, the temperature distribution of each zone Z after controlling the temperature using the model data is measured, and the coefficient of the model data is updated based on the measurement result. Therefore, the model data is modified according to the characteristics of the actual substrate processing apparatus 10, so that the precision of the temperature control may be improved. Further, since the coefficient of the model data is modified following the change in the substrate processing apparatus 10 as time passed due to wear of components, it is possible to suppress the deterioration of the precision of the control of the temperature distribution of each zone Z according to the change in the substrate processing apparatus 10 as time passed. Hereinafter, differences from the first embodiment will be mainly described.

Figure 14:
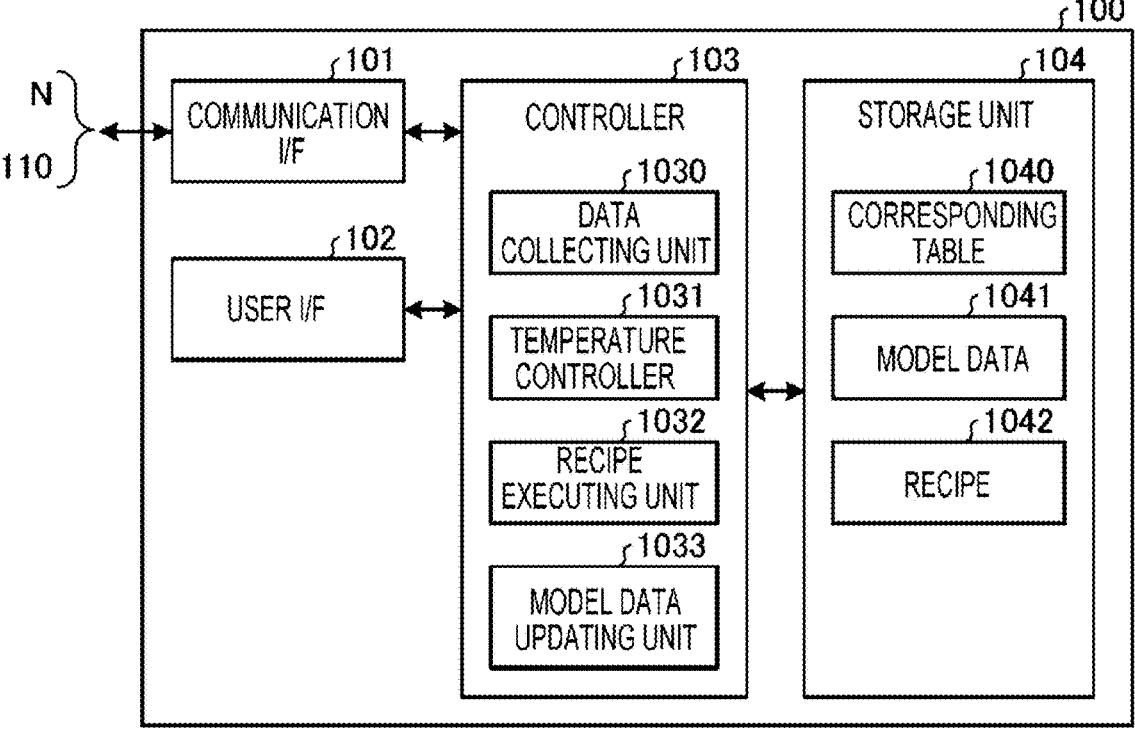
FIG. 14 is a view illustrating an example of a control device provided in a substrate processing apparatus of a second embodiment.

FIG. 14 is a view illustrating an example of the control device 100 provided in the substrate processing apparatus 10 of the second embodiment. In the embodiment, the controller 103 also realizes the function of a model data updating unit 1033 by executing the program stored in the storage unit 104. The model data updating unit 1033 updates the coefficient of the model data by adaptive control. The adaptive control is a control that eliminates a model error by updating the model based on the residual between the predicted value and the measured value during the running of the actual apparatus.

Figure 15:
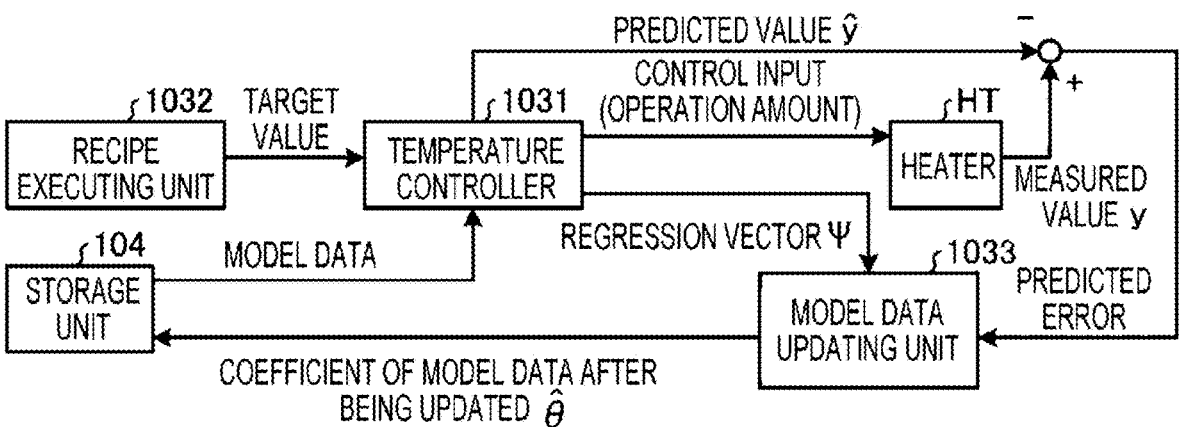
FIG. 15 is a view illustrating an example of a procedure for updating a coefficient of model data.

FIG. 15 is a view illustrating an example of a procedure for updating the coefficient of the model data. First, the recipe executing unit 1032 outputs the target temperature defined in the recipe 1042 in the storage unit 104 to the temperature controller 1031. The temperature controller 1031 specifies the power supplied to the heater HT in each zone Z as the operation amount using the model data 1041 in the storage unit 104. Then, for each heater HT, the temperature controller 1031 controls the switch SW2 of the heater control circuit 160 according to the specified operation amount. For each zone Z, the temperature controller 1031 outputs the predicted value of the temperature with respect to the operation amount to the model data updating unit 1033.

The model data updating unit 1033 collects resistance value data of the heater HT in each zone Z. Then, the model data updating unit 1033 specifies the temperature corresponding to the collected resistance value with respect to each zone Z, with reference to the corresponding table 1040 in the storage unit 104. The process that specifies the measured value of the temperature for each zone Z is an example of a process (f). Then, for each zone Z, the model data updating unit 1033 calculates the difference between the specified measured value and the predicted value output from the temperature controller 1031 as a predicted error. Then, the model data updating unit 1033 specifies the coefficient of the model data after being updated, for example, using Equations (8) to (11) below.

$$\hat{\theta}(t) = \hat{\theta}(t-1) + K(t)(y(t) - \hat{y}(t)) \tag{8}$$

$$\hat{y}(t) = \Psi^T(t)\hat{\theta}(t-1) \tag{9}$$

$$K(t) = \frac{P(t-1)\Psi(t)}{\lambda + \Psi^T(t)P(t-1)\Psi(t)} \tag{10}$$

$$P(t) = \frac{(I - K(t)\Psi^T(t))P(t-1)}{\lambda} \tag{11}$$

The definitions of each of the symbols illustrated in Equations 8 to 11 above are as follows.

y: Measured value $\hat{y}$: Predicted value $\Psi$: Regression vector (measured value, power supply voltage, chiller temperature)

$\lambda$: Forgetting coefficient $\hat{\theta}$: Coefficient of model data (coefficient of ARX model)

K: Adapting gain

P: Variance-covariance matrix

Then, the model data updating unit 1033 updates the coefficient of the model data 1041 in the storage unit 104 with the specified coefficient. The process that updates the coefficient of the model data 1041 is an example of a process (g). The temperature controller 1031 specifies the power supplied to the heater HT in each zone Z using the model data 1041 with the updated coefficient.

[Experiment Result]

Figure 16:
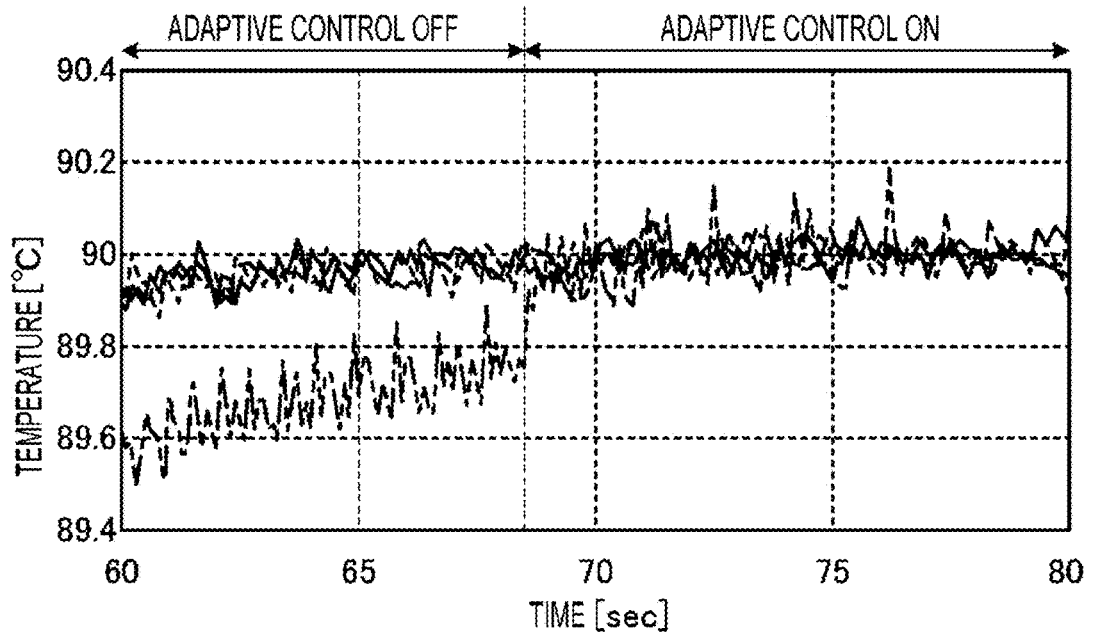
FIG. 16 is a view illustrating an example of an effect of adaptive control.

FIG. 16 is a view illustrating an example of an effect of the adaptive control. Similarly to the simulations in FIG. 11 and FIG. 13, FIG. 16 illustrates the change in the temperature of the four zones Z1, Z6, Z10, and Z13 (see FIG. 12) with relatively large temperature differences among the zones Z. By performing the adaptive control as illustrated in FIG. 16, comparing to the case where the adaptive control is not performed, it is possible to suppress the temperature difference between zones Z to be less than ±0.2° C. Therefore, it is possible to improve the precision of the control of the temperature distribution.

[Operation of Model Data Using Adaptive Control]

FIG. 17 is a flowchart illustrating an example of a procedure of an operation of the model data using the adaptive control. First, reference model data serving as a reference is created by using the temperature control data of a plurality of substrate processing apparatuses 10 serving as a reference (S300).

Subsequently, at the mass production site of the substrate processing apparatus 10, in the substrate processing apparatus 10 before shipment, a test operation is performed using the reference model data, and the reference model data is updated by the adaptive control (S301).

Subsequently, the reference model data after being updated is preserved in the storage unit 104 of the substrate processing apparatus 10 before shipment as individual model data (S302).

Subsequently, after the shipment of the substrate processing apparatus 10, at the production site of the substrate W, the operation is performed, and the individual model data is updated by the adaptive control (S303). In step S303, the individual model data before being updated is preserved in the storage unit 104 separately from the individual model data after being updated.

Then, when the operation of the substrate processing apparatus 10 is ended, the updated individual model data is discarded (S304). Then, when the operation of the substrate processing apparatus 10 is started again, the processing described in step S303 is performed again.

In this manner, in the embodiment, the updated individual model data is restored to the individual model data preserved at the time of shipment each time the operation is ended. Therefore, it is possible to prevent the control performance from being deteriorated when the next temperature condition is significantly changed by being adapted to the previous temperature setting by the adaptive control. In order to be adapted for the wear of components, it is conceivable to update the individual model data by executing a program for the adaptive control.

In the above, the second embodiment has been described. As described above, the model-based control method according to the embodiment further includes the process (f) and the process (g). In the process (f), the temperature data of each zone Z measured during the operation of the substrate processing apparatus 10 is acquired. In the process (g), the coefficient of each element of the state-space model is updated by the adaptive control, based on the error between the temperature predicted by using the state-space model and the temperature acquired in the process (f). Therefore, it is possible to reduce the error between the behavior of the actual temperature control members (the electrostatic chuck 118 and the edge ring ER) and the behavior of the state-space model of multi-input/multi-output. Therefore, it is possible to reduce the influence of the individual difference of the temperature control member on the model error. Further, it is possible to update the model by the error in the actual operation.

Third Embodiment

In the first embodiment and the second embodiment described above, it is assumed that each zone Z of the temperature control member is made of the same material. With regard to this, in the embodiment, when a zone Z made of a material different from the material of other zones Z is provided in the zones Z of the temperature control member, the ARX model is described by using the weighting coefficient w according to the magnitude of heat conduction with the zones Z.

For example, as illustrated in FIG. 18, a case where the zones Z1 to Z3 are made of a material A with a thermal conductivity kA, and the zone Z4 is made of a material B with a thermal conductivity kB is considered. The example in FIG. 18, the zone Z1 is adjacent to zones Z2 to Z4, and the areas of the boundary surfaces between the zone Z1 and each of the zones Z2 to Z4 are the same. Further, in the example in FIG. 18, the thicknesses of the boundary surfaces between the zone Z1 and each of the zones Z2 to Z4 are the same.

When the materials of the zones Z1 to Z4 are the same, the weighting coefficient is $w_{12}=w_{13}=w_{14}=\frac{1}{3}$. However, since the zones Z1 to Z3 and the zone Z4 are made of different materials, the weighting coefficient is modified as illustrated in Equation (13) below.

$$\left.\begin{aligned}\tilde{w}_{12} &= \frac{\lambda_A w_{12}}{\lambda_A w_{12} + \lambda_A w_{13} + \lambda_B w_{14}}\\\tilde{w}_{13} &= \frac{\lambda_A w_{13}}{\lambda_A w_{12} + \lambda_A w_{13} + \lambda_B w_{14}}\\\tilde{w}_{14} &= \frac{\lambda_B w_{14}}{\lambda_A w_{12} + \lambda_A w_{13} + \lambda_B w_{14}}\end{aligned}\right\} \quad (13)$$

In the above, the third embodiment has been described. As described above, in the model-based control method according to the embodiment, the weighting coefficient of each zone Z is determined based on the magnitude of the heat conduction due to the difference in the material between the zone Z and other zones Z adjacent to zone Z. Therefore, even when a zone Z made of a material different from the material of other zones Z is provided in the zones Z of the temperature control member, it is possible to assign a weight according to the actual magnitude of the heat conduction with the zones Z.

Others

Meanwhile, the technique disclosed in the present disclosure is not limited to the above-described embodiments, and various modifications may be made within the scope of the disclosure.

For example, in each embodiment described above, the weighting coefficient w is defined between adjacent zones Z and the weighting coefficient w is assumed to be zero between non-adjacent zones Z, but the disclosed technique is not limited thereto. As another embodiment, the weighting coefficient w may be assigned between the non-adjacent zones Z. The weighting coefficient between the non-adjacent zones Z may be determined, for example, in consideration of the distance between the zones Z and the material of a member interposed between the zones Z.

Further, in each embodiment described above, one heater HT is provided in each zone Z, and the temperature of the corresponding zone Z is estimated based on the resistance value of the heater HT, but the disclosed technique is not limited thereto. As another embodiment, a temperature sensor that measures the temperature of the zone Z may be provided for each zone Z. In this case, the distance between the temperature measurement point of the zone Z and other zones and the distance between the temperature measurement point of the zone Z and the heating point at which the heater HT is provided may be incorporated into the model data as weights. Further, when a plurality of temperature sensors is provided for each zone Z, for each measurement point, the distance between the temperature measurement point of the zone Z and other zones and the distance between the temperature measurement point of the zone Z and the heating point at which the heater HT is provided may be incorporated into the model data as a weight.

Further, in each embodiment described above, for example, the electrostatic chuck 118 and the edge ring ER are described as the temperature control member, but the disclosed technique is not limited thereto. Any members (e.g., the electrode plate 134 of the upper electrode 130, or the side wall of the processing container 112) other than the electrostatic chuck 118 and the edge ring ER may be used as long as they include a plurality of zones Z where temperature is controllable independently.

Further, the ARX model of each embodiment described above includes the power supply voltage v(t) of the heater HT and the chiller temperature z(t) as explanatory variables, but the disclosed technique is not limited thereto. When the power supply voltage v(t) and the chiller temperature z(t) are not changed during the operation of the substrate processing apparatus 10, the ARX model may not include the power supply voltage v(t) and the chiller temperature z(t) as explanatory variables. Further, as another embodiment, the frequency of the RF power, the magnitude of the RF power, the pressure in the processing container 112, the type of the gas supplied into the processing container 112, the flow rate of the gas supplied into the processing container 112 may be added as the explanatory variables.

According to the present disclosure, it is possible to more quickly bring the temperature distribution of the temperature control member to be close to the target temperature distribution.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A model-based control method comprising:
   (a) acquiring temperature control data including temperature data of each of a plurality of zones of a temperature control body provided in a processing apparatus, a temperature of each of the plurality of zones being individually controllable;
   (b) for each of the plurality of zones, specifying a temperature of another zone that is weight-averaged by a weighting coefficient determined according to a magnitude of heat transfer with the another zone;
   (c) for each of the plurality of zones, specifying a parameter of a state-space model of multi-input/single-output using the temperature of the another zone specified in (b) and the temperature control data acquired in (a);
   (d) creating a state-space model of multi-input/multi-output by assigning the parameter of the state-space model of multi-input/single-output specified in (c) to each element of the state-space model of multi-input/multi-output; and
   (e) controlling the temperature of each of the plurality of zones of the temperature control body using the state-space model of multi-input/multi-output.

2. The model-based control method according to claim 1, further comprising:
   (f) acquiring a temperature of each of the plurality of zones measured during an operation of the processing apparatus; and
   (g) updating a parameter of each element of the state-space model of multi-input/multi-output by an adaptive control, based on an error between a temperature predicted using the state-space model of multi-input/multi-output and the temperature acquired in (f).

3. The model-based control method according to claim 1, wherein the weighting coefficient of each of the plurality of zones is determined based on an area of a boundary surface or a length of a boundary with an adjacent zone, and
   the weighting coefficient with respect to a non-adjacent zone is zero.

4. The model-based control method according to claim 1, wherein the weighting coefficient of each of the plurality of zones is determined based on the magnitude of heat transfer due to a difference between a material of a zone and a material of another zone adjacent to the zone.

5. The model-based control method according to claim 1, wherein the processing apparatus is a substrate processing apparatus configured to process a substrate, and the temperature control body is a stage on which a substrate is placed and a temperature of the substrate is controlled.

6. The model-based control method according to claim 1, wherein the state-space model of multi-input/multi-output includes a term indicating a temperature of a coolant controlled by a chiller that cools the plurality of zones, and a term indicating a magnitude of a power supply voltage supplied to a heater that heats the plurality of zones.

7. The model-based control method according to claim 1, wherein the state-space model of multi-input/single-output is an auto-regressive exogenous (ARX) model.

8. The model-based control method according to claim 1, wherein in (c), the parameter of the state-space model of multi-input/single-output is specified using ordinary least squares regression (OLS), Lasso, Ridge, or Elastic Net.

9. The model-based control method according to claim 1, wherein at least one zone of the plurality of zones is different from an adjacent zone in at least one of a zone shape, a boundary surface shape, or a material.

10. The model-based control method according to claim 1, wherein the processing apparatus is a substrate processing apparatus configured to process a substrate, and the temperature control data including the temperature of each of the plurality of zones is acquired through the substrate placed on the temperature control body.

11. A model-based control system comprising:

a model data creating apparatus and a processing apparatus, wherein the model data creating apparatus includes:

a first controller configured to create a state-space model; and an output section configured to output the state-space model to the processing apparatus, wherein the processing apparatus includes:

a temperature control body including a plurality of zones where a temperature of each zone is individually controllable;

a storage configured to acquire and store the state-space model created by the model data creating apparatus; and a second controller configured to control a temperature of each of the plurality of zones of the temperature control body using the state-space model stored in the storage, and wherein the first controller performs:

(a) acquiring temperature control data including temperature data of each of the plurality of zones of the temperature control body;

(b) for each of the plurality of zones, specifying a temperature of another zone that is weight-averaged by a weighting coefficient determined according to a magnitude of heat transfer with the another zone;

(c) for each of the plurality of zones, specifying a parameter of a state-space model of multi-input/single-output using the temperature of the another zone specified in (b) and the temperature control data acquired in (a); and (d) creating a state-space model of multi-input/multi-output by assigning the parameter of the state-space model of multi-input/single-output specified in (c) to each element of the state-space model of multi-input/multi-output.

12. The model-based control system according to claim 11, wherein the second controller performs:

(e) controlling a temperature of each of the plurality of zones of the temperature control body using the state-space model of multi-input/multi-output stored in the storage;

(f) acquiring a temperature of each of the plurality of zones measured during an operation of the processing apparatus; and (g) updating a parameter of each element of the state-space model of multi-input/multi-output by an adaptive control, based on an error between a temperature predicted using the state-space model of multi-input/multi-output and the temperature acquired in (f).

13. A non-transitory computer-readable storage medium having stored therein a program that causes a computer to execute:

(a) acquiring temperature control data including temperature data of each of a plurality of zones of a temperature control body provided in a processing apparatus, temperature of each of the plurality of zones being individually controllable;

(b) for each of the plurality of zones, specifying a temperature of another zone that is weight-averaged by a weighting coefficient determined according to a magnitude of heat transfer with the another zone;

(c) for each of the plurality of zones, specifying a parameter of a state-space model of multi-input/single-output using the temperature of the another zone specified in (b) and the temperature control data acquired in (a); and (d) creating a state-space model of multi-input/multi-output by assigning the specified parameter of the state-space model of multi-input/single-output specified in (c) to each element of the state-space model of multi-input/multi-output.

* * * * *